(12) United States Patent
Arana et al.

(10) Patent No.: US 8,304,065 B2
(45) Date of Patent: Nov. 6, 2012

(54) TREATMENT FOR A MICROELECTRONIC DEVICE AND METHOD OF RESISTING DAMAGE TO A MICROELECTRONIC DEVICE USING SAME

(76) Inventors: Leonel Arana, Phoenix, AZ (US); Dingying Xu, Maricopa, AZ (US); Vijay Wakharkar, Paradise Valley, AZ (US); Wen Feng, Chandler, AZ (US); Nirupama Chakrapani, Gilbert, AZ (US); Shankar Ganapathysubramanian, Phoenix, AZ (US); Jorge Sanchez, Chandler, AZ (US); Mohit Mamodia, Chandler, AZ (US)

( * ) Notice: Subject to any disclaimer, the term of this patent is extended or adjusted under 35 U.S.C. 154(b) by 380 days.

(21) Appl. No.: 12/655,282

(22) Filed: Dec. 28, 2009

(65) Prior Publication Data

US 2011/0159256 A1    Jun. 30, 2011

(51) Int. Cl.
*B32B 7/02*    (2006.01)

(52) U.S. Cl. ........ 428/220; 428/212; 428/323; 428/352; 428/113; 428/121; 428/464

(58) Field of Classification Search ................. 428/213, 428/220, 323, 352, 212; 438/113, 121, 464
See application file for complete search history.

(56) References Cited

U.S. PATENT DOCUMENTS 5,418,107 A * 5/1995 Nealey et al. ................. 430/132
7,235,465 B2 * 6/2007 Senoo et al. ................. 438/464

* cited by examiner

*Primary Examiner* — Maria Veronica Ewald
*Assistant Examiner* — Lawrence Ferguson
(74) *Attorney, Agent, or Firm* — Kenneth A. Nelson

(57) ABSTRACT

A treatment for a microelectronic device comprises a dicing tape (110) and a polymer composite film (120) having a pigment or other colorant added thereto and, in some embodiments, a pre-cure glass transition temperature greater than 50° Celsius. The film can comprise multiple layers, with one layer being tacky and the other layer non-tacky at a given temperature.

11 Claims, 4 Drawing Sheets

TREATMENT FOR A MICROELECTRONIC DEVICE AND METHOD OF RESISTING DAMAGE TO A MICROELECTRONIC DEVICE USING SAME

FIELD OF THE INVENTION

The disclosed embodiments of the invention relate generally to microelectronic devices, and relate more particularly to films or other treatments for use with such devices.

BACKGROUND OF THE INVENTION

A die backside film (DBF) is (typically) a wafer level film, often between 5 and 50 micrometers (abbreviated herein as "microns" or "µm") thick, that may be laminated on or otherwise applied to the backside of a silicon (or other) wafer. (References herein to silicon (Si) should be taken as illustrative; other suitable wafer materials may also be used.) Such application may take place after the wafer has been thinned. The DBF is typically a polymer/inorganic composite and is permanently attached to the back side of the die following a curing of the film. Among other things, such films increase the reliability of a microelectronic package containing the coated die and offer significant protection against die cracking and warping during package assembly and handling. Such films can be especially advantageous for products sold or shipped as bare die packages, which otherwise (i.e., in the absence of such films) would be more likely to be subjected to wear, abrasion, or other backside damage introduced during the assembly/test process (or arising from other sources) possibly leading to poor die backside visual appearance and/or die cracking during use.

BRIEF DESCRIPTION OF THE DRAWINGS

The disclosed embodiments will be better understood from a reading of the following detailed description, taken in conjunction with the accompanying figures in the drawings in which.

Figure 1:
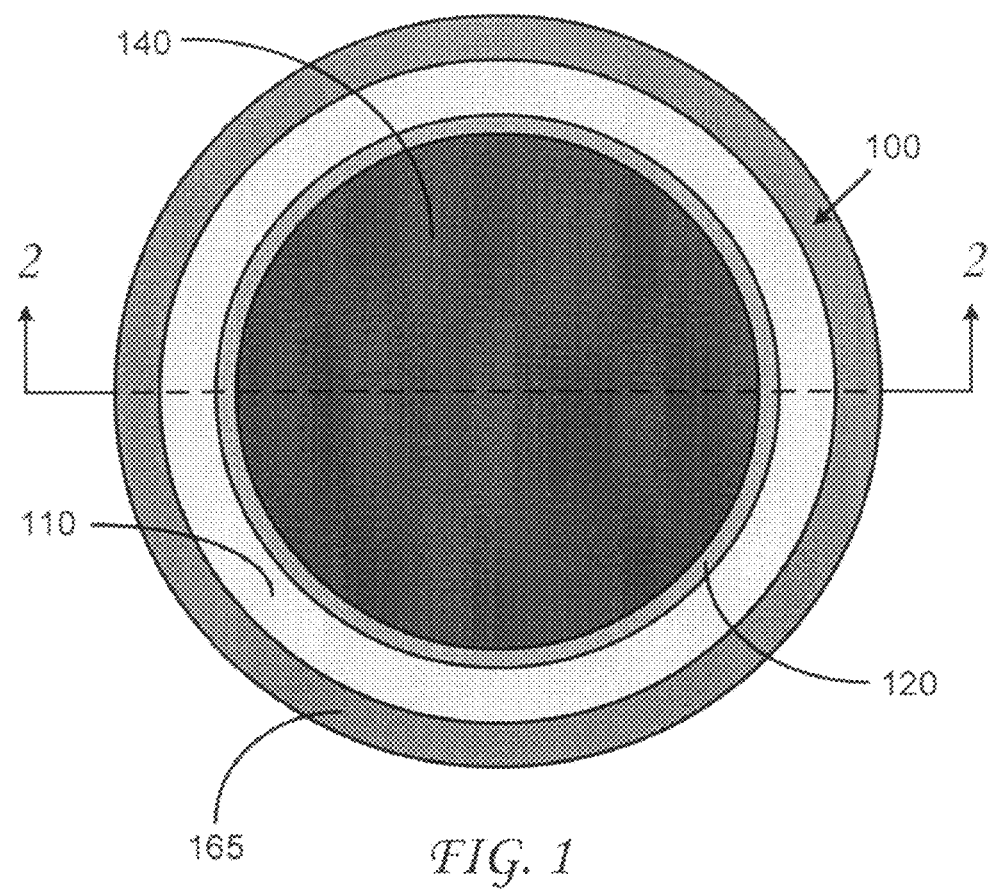
FIG. 1 is a plan view of a treatment for a microelectronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a treatment for a microelectronic device comprises a dicing tape and a polymer composite film comprising a pigment or other colorant and, in some embodiments, a pre-cure glass transition temperature greater than 50° Celsius. The film acts as a die backside protection layer to prevent cracking and other damage.

It was mentioned above that die backside films can increase package reliability and can protect against die cracking and warping, especially for bare die packages. However, existing backside films in use today use dedicated equipment in order to apply and cure such films onto the backside of a wafer using lamination or stencil printing. This approach is expensive and inefficient because it complicates the assembly process with additional steps and requires additional equipment. Embodiments of the invention address these shortcomings by combining the film with a dicing tape, thus simplifying the assembly process and eliminating the need for additional equipment. The integration of the film into the dicing tape also enables extension of the technique to much thinner wafers, as the process benefits from well-established thin wafer handling equipment and processes such as are used in integrated wafer thinning systems. Furthermore, embodiments of the invention enable additional die protection that is not usually available in a bare die package.

Embodiments of the invention employ a polymer composite backside film to improve die appearance and break strength by serving as a wear-resistant film that resists damage initiation due to handling of the die or bare die package and resists propagation into the silicon die of any damage that does form. The film may reduce or even eliminate yield loss associated with die cracking. In addition, the film may in certain embodiments improve the appearance of the backside of the die by concealing blemishes (e.g., scratches, scuffs, chips, etc.) introduced during wafer fabrication, if the film is made sufficiently opaque. (Alternatively the film may be made clear.) These films can be useful in die protection not only during high-volume assembly but also throughout the lifetime of the package.

In some embodiments the film may also reduce thin die dynamic warpage, which is known to lead to yield loss for thin die during chip attach (also referred to herein as die attach), by balancing relatively high thermal expansion coefficients of metallization on the die active side, and may improve the readability of laser marks on the die by offering enhanced contrast relative to the bare silicon die. Moreover, the film may improve the performance of thermal interface materials applied on top of the die. This may be done by improving wettability and by providing reaction sites for solder-type thermal interface materials and/or by improving wettability, adhesion, and/or increased filler contact area for polymer-composite-type thermal interface materials (greases, gels, adhesives, phase change materials, and the like).

The wafer-level application process of embodiments of the present invention, whereby the backside film is first integrated in an uncured or partially cured state with the dicing tape, allows the backside film to be applied with virtually no impact to productivity levels (because it can be applied simultaneously with dicing tape lamination) or to existing assembly processes. Additionally, film lamination enables the use of multi-layer film (e.g., multi-layer for improved adhesion, black on white for good laser mark readability) or a patterned or textured film (e.g., stiffening ribs, texturing for improved contact resistance to polymeric composite thermal interface material (TIM)). Film lamination also leads to excellent film uniformity and allows the use of higher viscosity, filled resins (e.g., highly filled polyimide) that are difficult to apply by spraying or spin coating.

Figure 2:
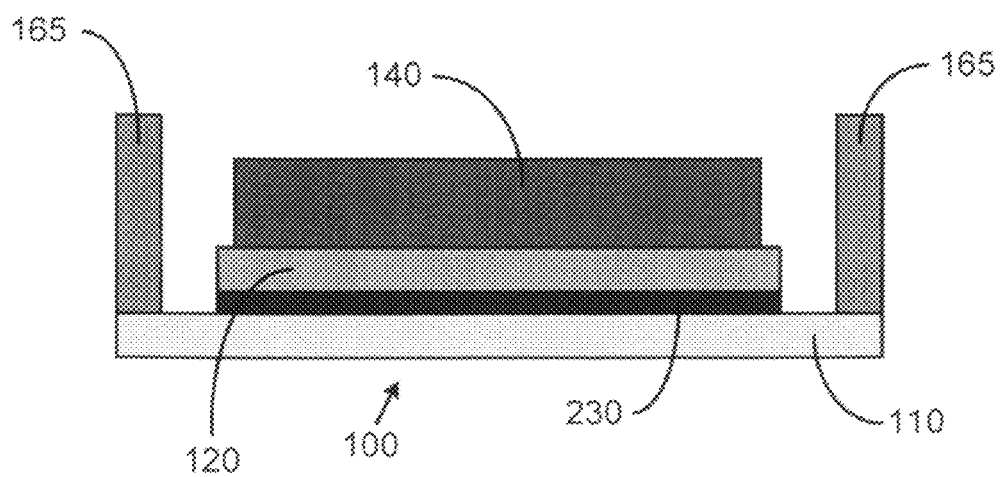
FIGS. 2 and 3 are cross-sectional views of the treatment of FIG. 1 according to embodiments of the invention.

Referring now to the drawings, FIG. 1 is a plan view of a treatment 100 for a microelectronic device according to an embodiment of the invention. FIG. 2 is a cross-sectional view of treatment 100 taken along a section line 2-2 in FIG. 1. As illustrated in FIGS. 1 and 2, treatment 100 comprises a dicing tape 110 and a polymer composite film 120 that includes carbon black or another colorant. In one embodiment, polymer composite film 120 has a pre-cure glass transition temperature ($T_g$) that is no less than 50° Celsius (C). Treatment 100 may further comprise a release liner 230 between dicing tape 110 and polymer composite film 120. Treatment 100 is depicted with a ring frame 165 placed thereon such as may be used to facilitate wafer handling and singulation.

As will be further discussed below, treatment 100 may be applied to the backside of a wafer 140. Polymer composite film 120 may comprise epoxy, polyimide, polynorborne, bismaleimide, acrylate, or another suitable material, and in certain embodiments may contain filler particles in the micron (less than 100 μm) and/or nanometer (less than 1 μm) size range. The film can be made transparent through the use of index-matched fillers or of fillers sufficiently smaller than 400 nanometers (nm). Alternatively, the film can be made opaque and/or tinted (in order to conceal backside blemishes).

For many reasons, including security, branding, inventory control, and the like, it may be advantageous to have the ability to make a readable mark on the backside surface of wafer 140. Such marks may be made, for example, by ink printing or by laser engraving, with the latter method often being preferable because it offers better resolution. In order for such laser engraving to be visible, however, the engraved areas must provide sufficient contrast with the areas that have not been engraved. Perhaps even more crucial for visibility is the presence of a material that absorbs the laser radiation in order to allow local thermal ablation and thus enable engraving of the film. This is why a pigment such as carbon black, or another colorant, is added to film 120: in order to increase the contrast between laser-engraved and non-engraved areas on the backside of wafer 140 and to absorb the laser radiation.

Existing die backside films tend to be tacky at temperatures from 25° C. to 50° C. After lamination the DBF-coated die are placed in tape-n-reel with cover tape for shipment, where the DBF is in contact with, and may stick to, the cover tape, especially under high temperature and humidity conditions. To use a practical example, the DBF material should remain non-tacky even after four days at conditions of 50° C. and 55% relative humidity. Existing films cannot meet this requirement but polymer composite film 120, with its pre-cure $T_g$ of at least 50° C. (at least in some embodiments), enables die shipment without cover tape sticking even under the relatively extreme conditions set forth above.

Along with its advantages, a relatively-high glass transition temperature such as has been described herein may come with a cost: a potentially smaller process window (lamination temperatures from 70° C. to 80° C.). These higher lamination temperatures can cause the dicing tape to deform or degrade during lamination, thereby leading to problems during subsequent die picking processes. In addition a film with relatively high glass transition temperature may have poor adhesion to silicon and can ultimately lead to film delamination during the die picking process. Accordingly, polymer composite film 120, according to embodiments discussed above, may at times suffer from poor adhesion to the silicon surface of wafer 140 because of its otherwise-desirable high $T_g$. The resulting difficult lamination conditions and other issues may be overcome by providing a multilayer DBF, embodiments of which will now be further described.

A dual-layer DBF may be designed such that one layer is tacky (in order to provide easy lamination to Si) while the other is non-tacky (in order to avoid sticking during shipment or during the chip attach process). The non-tacky layer has relatively high $T_g$ (i.e., of at least 50° C. in certain embodiments, as stated earlier) to prevent any sticking to the cover tape of the tape-n-reel shipping containers, and may contain carbon black or another colorant in order to enable laser marking. The tacky layer provides better lamination to Si, or in other words, enables better adhesion to a Si (or other) surface at a lower lamination temperature. Thus, embodiments of the invention may both improve DBF lamination to Si and avoid unwanted DBF sticking.

Figure 3:
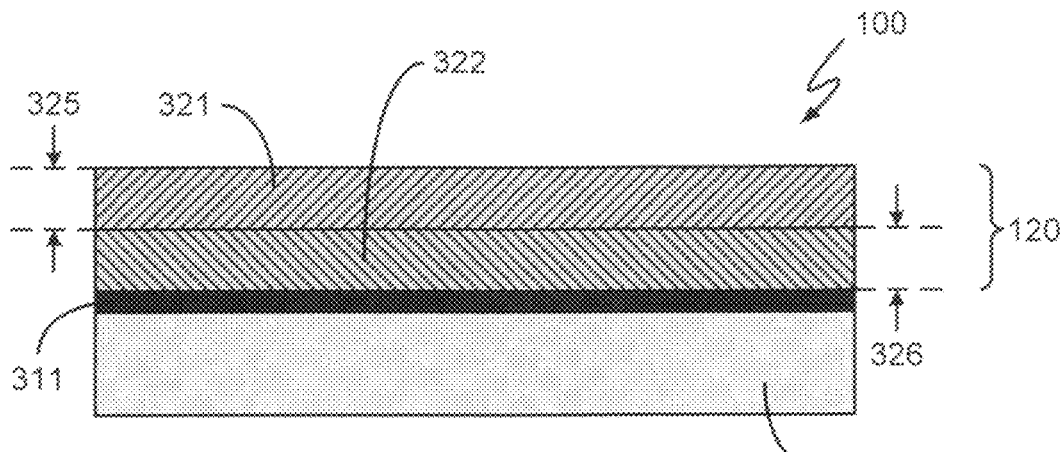

Continuing the ideas introduced in the preceding paragraphs, in some embodiments polymer composite film 120 comprises a first layer that is tacky below a temperature of 50° C. and a second layer that is non-tacky below the temperature of 50° C. This is illustrated in FIG. 3, which is a cross-sectional view of treatment 100 according to an embodiment of the invention. As an example, the difference in properties can come from slight changes in chemistry and filler content. The tacky layer, for example, is likely to have lower filler content than the non-tacky layer.

As shown in FIG. 3, an adhesive layer 311 is located on dicing tape 110 of treatment 100, and polymer composite film 120 comprises a layer 321 having a thickness 325 and a glass transition temperature less than 80° C. and a layer 322 having a thickness 326 and a glass transition temperature greater than 50° C. Dicing tape 110 is used to enable dicing as well as die pickup. Adhesive layer 311 may be required in order to provide a level of bonding between layer 322 of the DBF and dicing tape 110 that is sufficient to prevent any die fly-off at dicing.

Layers 321 and 322 can have similar base chemistries in order to enable strong adhesion between them. The two layers are depicted as having equal thicknesses, but in various embodiments the layers can be of unequal thickness, with either of the two layers being the thicker one. As an example, for an overall film thickness of 20 microns, layers 321 and 322 can have respective thicknesses of 5 and 15 μm, 10 and 10 μm, 15 and 5 μm, or any other thickness combination. Furthermore, thicknesses 325 and 326 can be specifically tailored to provide advantages for various applications such as laser marking, stringer reduction, etc. For example, in order to reduce stringers (pieces of DBF that come off during saw and get stuck on the die) a relatively thin tacky layer may be used, as it's the tacky layer that may come off as stringers and stick onto the die. For laser marking a relatively thin tacky layer may also be used, leaving a thicker non-tacky layer so that the entire depth of the laser mark is contained within this layer, which has the colorant.

Figure 4:
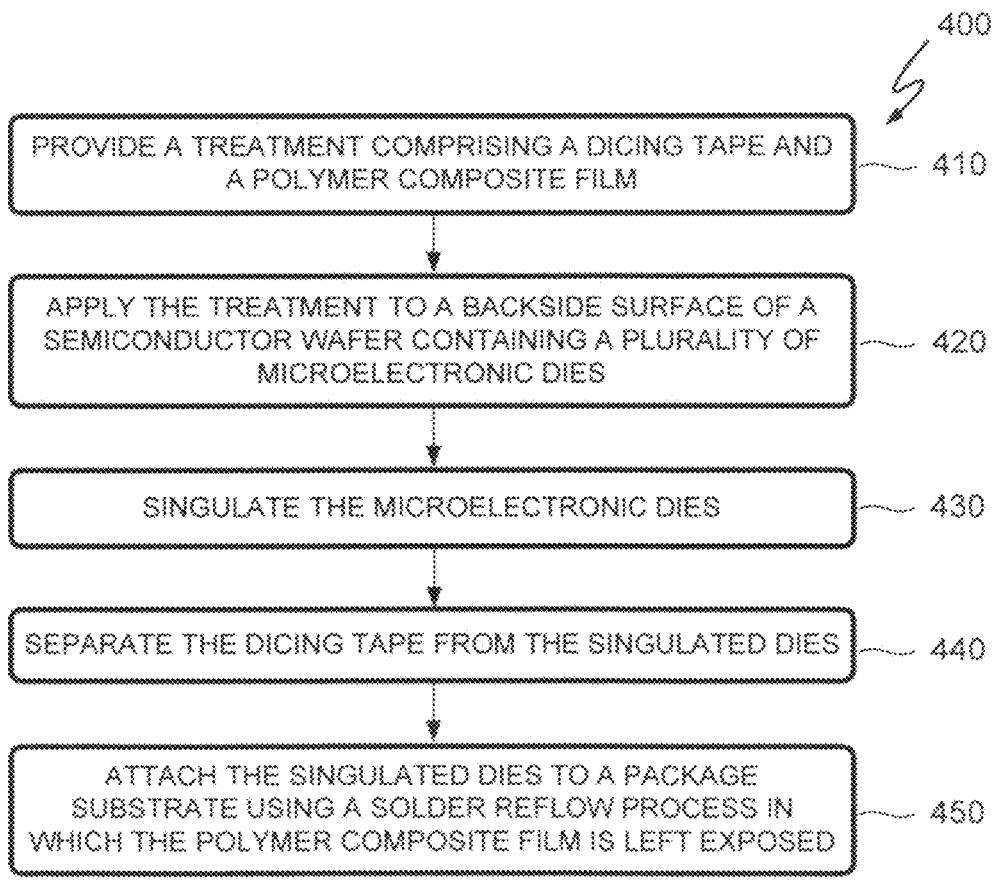
FIG. 4 is a flowchart illustrating a method of resisting damage to a microelectronic device according to an embodiment of the invention.

FIG. 4 is a flowchart illustrating a method 400 of resisting damage to a microelectronic device according to an embodiment of the invention. As an example, method 400 may use a treatment similar to treatment 100 that is shown in FIG. 1-3.

A step 410 of method 400 is to provide a treatment comprising a dicing tape and a polymer composite film. As an example, the dicing tape can be similar to dicing tape 110 and the polymer composite film can be similar to polymer composite film 120, both of which are first shown in FIG. 1. Accordingly, in one embodiment the polymer composite film can comprise a first layer having a first thickness (e.g., similar to layer 321 and thickness 325 that are shown in FIG. 3) and a first glass transition temperature, and further comprise a second layer having a second thickness (e.g., similar to layer 322 and thickness 326 that are also shown in FIG. 3) and a second glass transition temperature. As discussed above, the first layer can be a tacky layer suitable for lamination at acceptable temperatures while the second layer is a non-tacky layer that will not stick to chip attach nozzles, tape-n-reel cover tape, or the like. In one embodiment, step 410 or another step comprises adjusting a glass transition temperature of the first layer which, as an example, can comprise adjusting the chemistry of the first layer.

Figure 5:
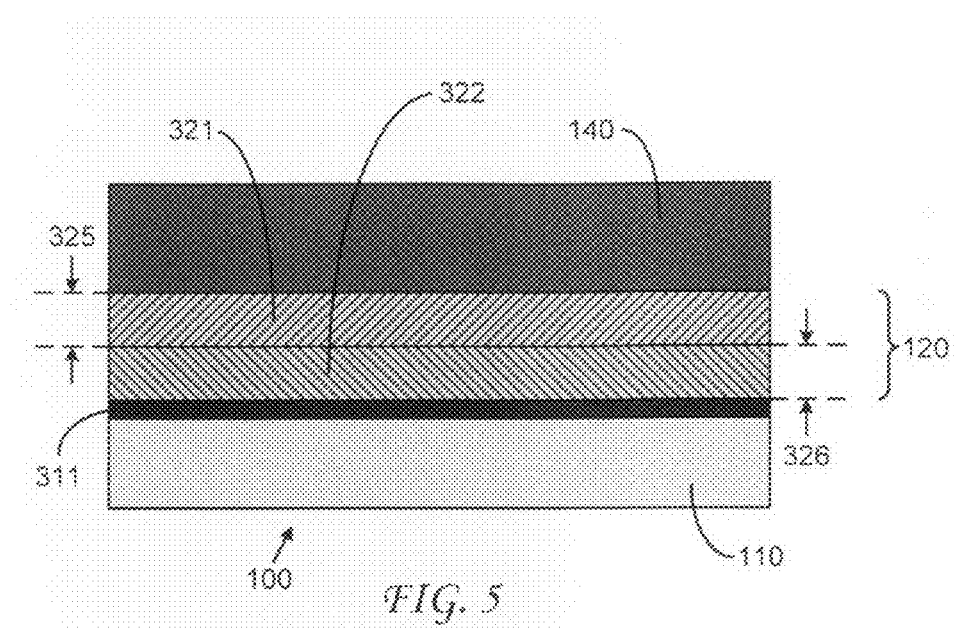
FIGS. 5-9 are cross-sectional views of the treatment of FIG. 1 (or portions thereof) along with a wafer or a singulated die as well as, in some cases, additional manufacturing components, at various stages of a manufacturing process according to an embodiment of the invention.

A step 420 of method 400 is to apply the treatment to a backside surface of a semiconductor wafer containing a plurality of microelectronic dies. This and subsequent steps of method 400 are represented in FIGS. 5-9, which are cross-sectional views of treatment 100 (or portions thereof) at various stages of a manufacturing process according to an embodiment of the invention. As an example, the wafer can be similar to wafer 140 that is first shown in FIG. 1 and that is also shown in FIG. 5, which depicts the treatment and the wafer following the performance of step 420 according to an embodiment of the invention. FIG. 5 is similar to FIG. 2 except that FIG. 5 does not show the ring frame or the release liner that are shown in FIG. 2. In at least some embodiments, the wafer may be thinned by backgrinding or the like prior to the attachment of the treatment.

It should be mentioned here that an alternative approach is to apply the polymer composite film at the die level. This approach would involve the preparation and attachment of a die-shaped piece of film (without the dicing tape, the utility of which would already have been realized earlier in the process flow) to individual dies following singulation. However, the wafer-level approach of method 400 may be preferred in at least some embodiments because it offers better alignment and requires fewer processing steps.

In one embodiment, step 420 comprises laminating the treatment onto the backside surface and then curing the polymer composite film. As mentioned, step 420 may be performed following a wafer thinning procedure. In one embodiment, step 420 or another step comprises applying heat to the treatment during its application. Doing so may improve bonding of the polymer composite film to the silicon surface of the wafer. In an exemplary process flow, the thinned wafer is laminated with a 2-in-1 type of film that may be similar in some respects to a wafer-level die attach film that comes with dicing tape built in. The film adheres directly to the Si wafer surface.

As an example, curing the polymer composite film can comprise irradiating the film with ultra-violet (UV) radiation in order to fully cure it. As another example, curing the polymer composite film comprises irradiating the film with UV radiation in order to partially cure it (to a point where the adhesive is no longer tacky) and then (if desired) exposing the film to thermal radiation (e.g., during an underfill process or a chip attach reflow process) in order to bring it from a partially cured to a fully cured state. Alternatively, the film may be left in its partially-cured state.

Figure 6:
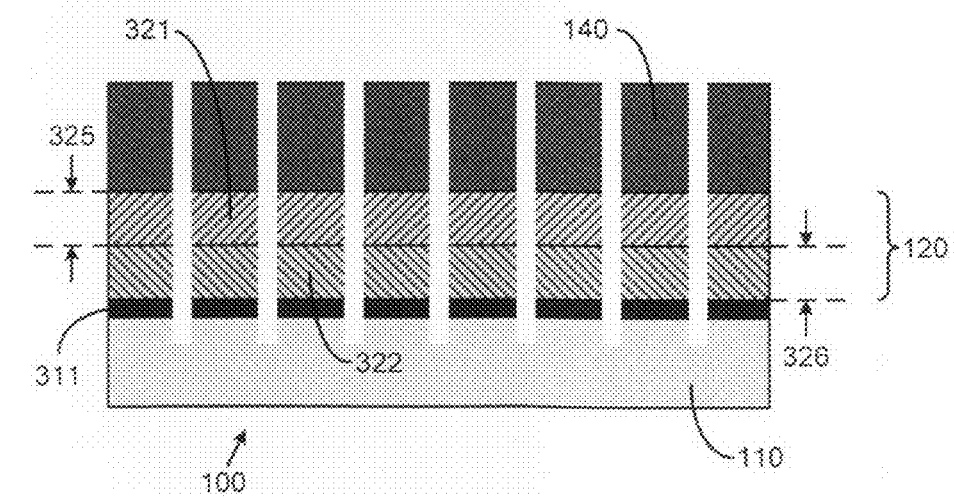

A step 430 of method 400 is to singulate the microelectronic dies. FIG. 6 depicts wafer 140 and dicing tape 110 along with polymer composite film 120 (i.e., treatment 100) after they have been cut (diced) with a saw or the like. As an example, the wafer singulation may be performed using a standard process such as wafer coat+laser scribe+saw. As shown, the saw blade simultaneously cuts through the wafer and the backside film and into the dicing tape. After saw, the die are picked in standard equipment such as TRDS (tape and reel die sort). At this stage the treatment remains attached to the die. As mentioned earlier, the presence of the treatment on the die during die attach may offer some coefficient of thermal expansion (CTE) balancing to reduce thin die dynamic warpage.

Figure 7:
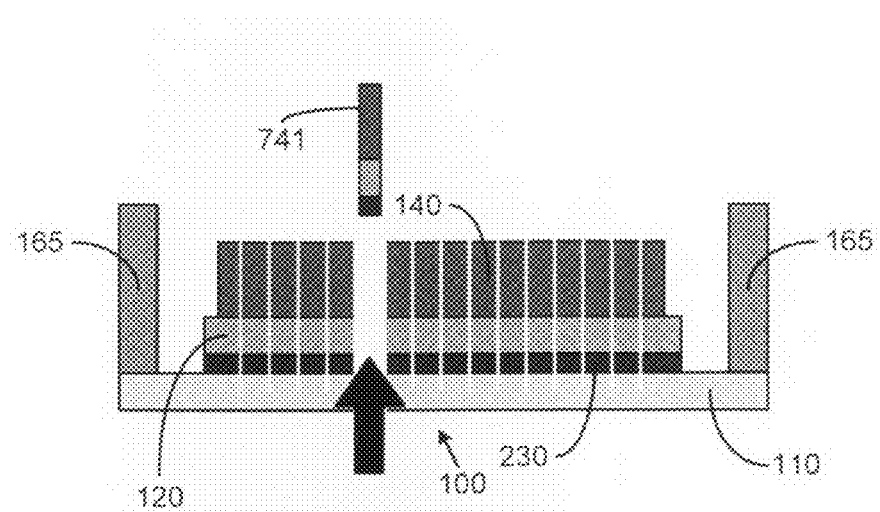

FIG. 7 depicts a point during the singulation process at which a singulated die 741 with film 120 has been ejected from the dicing tape being held within ring frame 165. The process may include standard pick and place processing such as TRDS, wafer die ejector, or the like.

Figure 8:
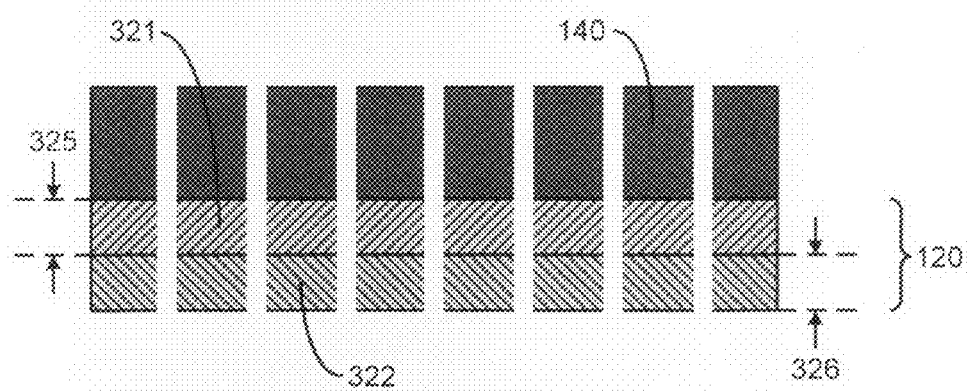

A step 440 of method 400 is to separate the dicing tape from the singulated dies. As an example, step 440 may comprise several sub-steps in which the die (with the DBF attached) are removed one at a time from the dicing tape and placed into the tape and reel (using TRDS) or directly onto the substrate in the chip attach process (using WDE). The dicing tape and wafer remnants are left behind on the tape and reel while all the good die are picked off for subsequent chip attach processing. FIG. 8 depicts the singulated dies with film 120 after the dicing tape and the adhesive layer have been separated. It may be seen that the exposed surface of layer 322, according to the embodiments and concepts discussed above, is a non-tacky surface that, when brought into contact with a cover tape during die shipment, will resist sticking to the cover tape.

Figure 9:
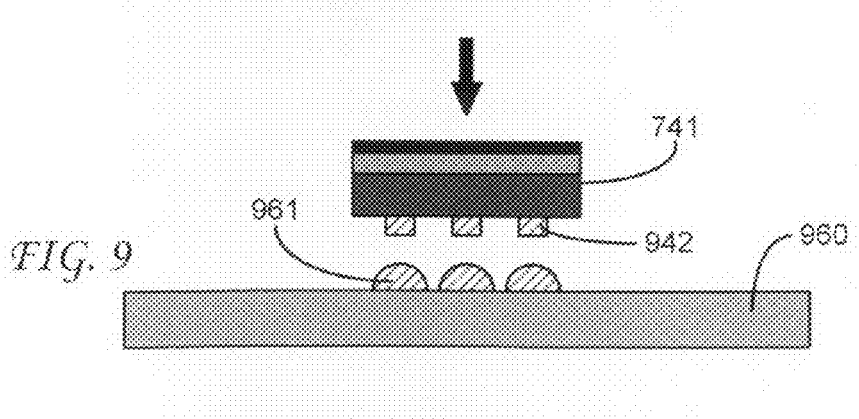

A step 450 of method 400 is to attach the singulated dies to a package substrate using a solder reflow process in which the polymer composite film is left exposed. FIG. 9 is a representation of a chip attach procedure in which singulated die 741 (with interconnect structures 942) is positioned over a substrate 960 having solder bumps 961 in preparation for attachment by solder reflow.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the die backside films and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A treatment for a microelectronic device, the treatment comprising:
    a dicing tape; and
    a polymer composite film comprising a colorant and further comprising a first layer that is tacky below a temperature of 50° C. and a second layer that is non-tacky below the temperature of 50° C.

2. The treatment of claim 1 wherein:
    the polymer composite film has a pre-cure glass transition temperature that is greater than 50° Celsius.

3. The treatment of claim 1 further comprising:
    a release liner between the dicing tape and the polymer composite film.

4. The treatment of claim 1 wherein:
    the polymer composite film contains filler particles.

5. The treatment of claim 4 wherein:
    the filler particles are no greater than 100 micrometers in size.

6. The treatment of claim 5 wherein:
    the filler particles are no greater than 1 micrometer in size.

7. A treatment for a microelectronic device, the treatment comprising:
    a dicing tape having an adhesive layer thereon; and
    a polymer composite film comprising:
    a first layer having a first thickness and a first glass transition temperature; and
    a second layer having a second thickness and a second glass transition temperature, wherein:
        the first glass transition temperature is less than 80° Celsius and the second glass transition temperature is greater than 50° Celsius.

8. The treatment of claim 7 wherein:
    the first layer has a first filler content and the second layer has a second filler content that is greater than the first filler content.

9. The treatment of claim 7 wherein:
    the first thickness is equal to the second thickness.

10. The treatment of claim 7 wherein:
    the first thickness is greater than the second thickness.

11. The treatment of claim 7 wherein:
    the first thickness is less than the second thickness.

\* \* \* \* \*